US009933614B2

(12) United States Patent
Uchiyama et al.

(10) Patent No.: US 9,933,614 B2
(45) Date of Patent: Apr. 3, 2018

(54) ELECTRO-OPTIC DEVICE, ELECTRO-OPTIC UNIT, AND ELECTRONIC APPARATUS

(71) Applicant: SEIKO EPSON CORPORATION, Tokyo (JP)

(72) Inventors: Suguru Uchiyama, Suwa (JP); Kosuke Takahashi, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/467,036

(22) Filed: Mar. 23, 2017

(65) Prior Publication Data

US 2017/0285329 A1 Oct. 5, 2017

(30) Foreign Application Priority Data

Mar. 29, 2016 (JP) ................................. 2016-065205

(51) Int. Cl.
*G02B 26/08* (2006.01)
*H01L 23/04* (2006.01)
*H01L 23/31* (2006.01)
*H01L 23/467* (2006.01)
(Continued)

(52) U.S. Cl.
CPC .......... *G02B 26/0833* (2013.01); *H01L 23/04* (2013.01); *H01L 23/3121* (2013.01); *H01L 23/3135* (2013.01); *H01L 23/467* (2013.01); *H01L 23/49822* (2013.01); *H01L 23/49827* (2013.01); *H01L 23/49838* (2013.01); *H01L 24/49* (2013.01); *H01L 2224/48091* (2013.01); *H01L 2224/48106* (2013.01); *H01L 2224/48227* (2013.01)

(58) Field of Classification Search
CPC . H01L 31/0203; H01L 23/04; H01L 23/3121; H01L 23/3135; H01L 23/467; H01L 23/49822; H01L 23/49827; H01L 23/49838; H01L 24/49; H01L 2924/14; H01L 2924/1461; H01L 2224/16145; H01L 2924/01079; G02B 26/0833; G02B 26/0816; G02B 7/1821
USPC ...................................... 359/223.1, 290–297
See application file for complete search history.

(56) References Cited

U.S. PATENT DOCUMENTS 7,456,497 B2   11/2008   Higashi
7,898,724 B2   3/2011    Liu et al.
8,216,884 B2   7/2012    Higashi
(Continued)

FOREIGN PATENT DOCUMENTS

JP   2004-209585 A   7/2004
JP   2011-027973 A   2/2011

*Primary Examiner* — Euncha Cherry
(74) *Attorney, Agent, or Firm* — Oliff PLC

(57) ABSTRACT

An electro-optic device includes a chip provided with a mirror and a drive element adapted to drive the mirror, a light-transmitting cover adapted to cover the mirror in a planar view, and a spacer having contact with one surface of the chip between the cover and the chip. The entire part of one surface of the chip having contact with the spacer is made of a first material such as silicon oxide film having first thermal conductivity, and the spacer is made of a second material such as a quartz crystal having second thermal conductivity higher than the first thermal conductivity. The cover is made of a third material such as sapphire having third thermal conductivity higher than the second thermal conductivity.

7 Claims, 10 Drawing Sheets

(51) Int. Cl.
*H01L 23/498* (2006.01)
*H01L 23/00* (2006.01)

(56) References Cited

U.S. PATENT DOCUMENTS

| | | |
|---|---|---|
| 2005/0167795 A1 | 8/2005 | Higashi |
| 2008/0150065 A1* | 6/2008 | Oda .................... H01L 31/0203 |
| | | 257/434 |
| 2009/0068795 A1 | 3/2009 | Higashi |

* cited by examiner

ELECTRO-OPTIC DEVICE, ELECTRO-OPTIC UNIT, AND ELECTRONIC APPARATUS

The entire disclosure of Japanese Patent Application No. 2016-065205, filed Mar. 29, 2016 is expressly incorporated by reference herein.

BACKGROUND

1. Technical Field

The present invention relates to an electro-optic device equipped with a mirror, an electro-optic unit, and an electronic device.

2. Related Art

As an electronic apparatus, there has been known, for example, a projection-type display device, which modulates the light emitted from a light source using a plurality of mirrors (micro mirrors) of an electro-optic device called a digital mirror device (DMD), and then projects the modulated light in an enlarged manner using a projection optical system to thereby display an image on a screen. The electro-optic device used for such a projection-type display device includes, for example, a chip provided with mirrors and a drive element for driving the mirrors, a cover having a light transmissive property and covering the mirrors in a planar view, and a spacer located between the cover and the chip, and the spacer has contact with the cover and the chip. In the electro-optic device configured in such a manner, the light from the light source is transmitted through the cover to enter the mirrors, and the light reflected by the mirrors is transmitted through the cover, and is then emitted. Therefore, the cover rises in temperature due to the irradiation of the light, and the temperature of the chip rises accordingly. Further, while operating, the chip itself also generates heat. Such rise in temperature of the chip causes a false operation and a decrease in life of the electro-optic device, and is therefore undesirable.

Incidentally, as a method of improving the heat radiation performance of a device mounted on a support substrate, there has been proposed a configuration in which a side surface of the spacer is covered with sealing resin, and at the same time, a surface of the sealing resin has contact with the light-transmitting cover at a position higher than the position at which the surface of the sealing resin has contact with the spacer (see U.S. Pat. No. 7,898,724 B2 (Document 1)).

However, even if the heat-transfer efficiency from the cover to the sealing resin is improved with the configuration described in Document 1, the thermal conductivity of the sealing resin itself is low, and therefore, there is a problem that the rise in temperature of the chip cannot sufficiently be suppressed.

SUMMARY

An advantage of some aspects of the invention is to provide an electro-optic device, an electro-optic unit, and an electronic apparatus each capable of suppressing the rise in temperature of the chip provided with the mirrors.

An electro-optic device according to an aspect of the invention includes a chip provided with a mirror and a drive element adapted to drive the mirror, a light-transmitting cover adapted to cover the mirror in a planar view, and a spacer located between the cover and the chip, and having contact with one surface of the chip, an entire part of the one surface having contact with the spacer is made of a first material having first thermal conductivity, and the spacer is made of a second material having second thermal conductivity higher than the first thermal conductivity.

In the aspect of invention, the light is transmitted through the cover to enter the mirror, and the light reflected by the mirror is transmitted through the cover, and is then emitted. On this occasion, the cover rises in temperature due to the irradiation of the light. However, the spacer is made of the second material higher in thermal conductivity than the first material constituting the part of the one surface of the chip having contact with the spacer. Therefore, the heat of the cover is hard to be transferred to the chip via the spacer. Further, the heat generated by the chip is easily released toward the spacer. Therefore, it is possible to suppress the rise in temperature of the chip.

The aspect of the invention may be configured to further include a sealing material adapted to cover an entire side surface of the spacer and an entire side surface of the cover. According to such a configuration, it is possible to release the heat of the cover and the heat of the spacer to the sealing material.

The aspect of the invention may be configured such that the cover is made of a third material having third thermal conductivity higher than the second thermal conductivity. According to such a configuration, it is possible to release the heat of the chip to the cover via the spacer.

The aspect of the invention may be configured such that the cover is made of a third material having third thermal conductivity lower than the second thermal conductivity.

The aspect of the invention may be configured such that the spacer and the cover are made of the same material.

In an electro-optic unit having the electro-optic device to which the invention is applied, it is preferable to include a blower adapted to supply air to the electro-optic device. According to such a configuration, since the heat of the electro-optic device can efficiently be released, deterioration of the reliability of the electro-optic device and so on can be suppressed.

The electro-optic device to which the invention is applied can be used for a variety of electronic apparatuses, and in this case, the electronic apparatus is provided with a light source section for irradiating the mirror with the source light. Further, in the case of configuring a projection-type display device as the electronic apparatus, the electronic apparatus is further provided with a projection optical system for projecting the light modulated by the mirror.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
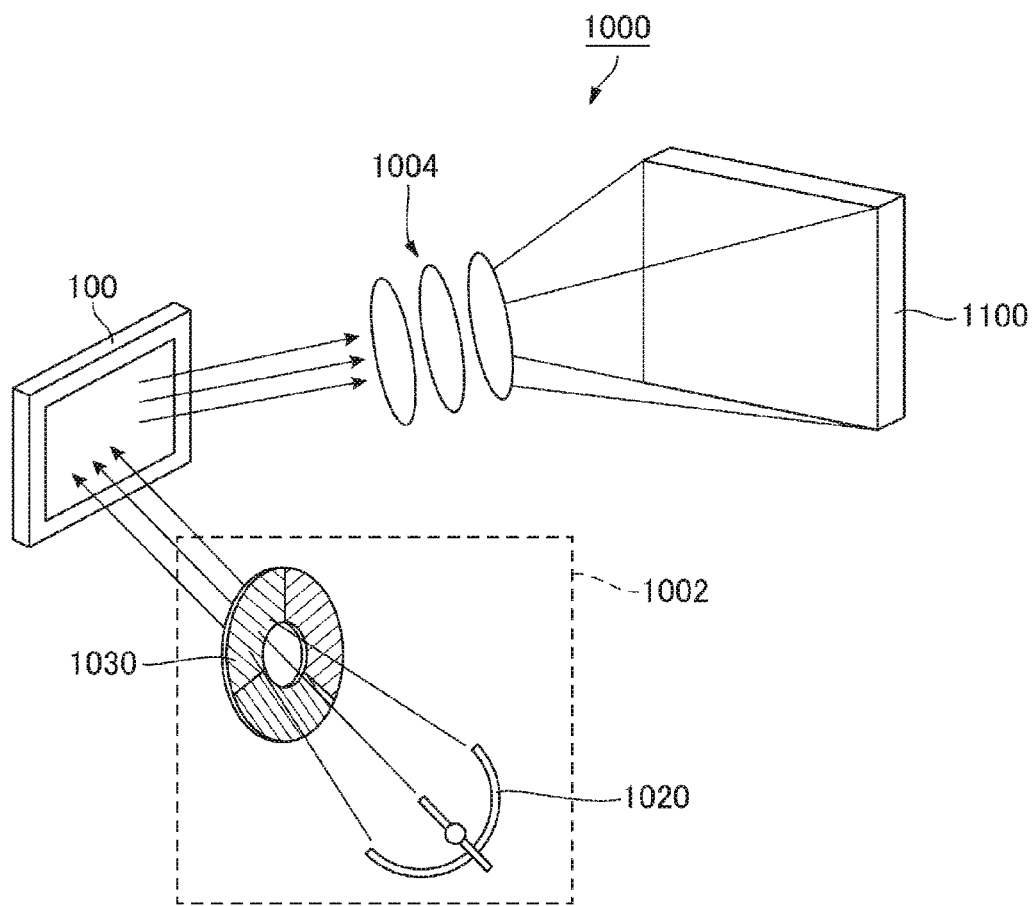
FIG. 1 is an explanatory diagram schematically showing an example of an optical system provided to a projection-type display device to which the invention is applied.

An embodiment of the invention will be described with reference to the accompanying drawings. It should be noted that in the following description, a projection-type display device will be explained as an electronic apparatus to which the invention is applied. Further, in the drawings referred to in the following description, the scale ratios of the layers and the members are made different from each other in order to provide the layers and the members with the sizes in a recognizable range on the drawings. Although the number of the mirrors and so on shown in the drawings is set so as to provide the size in the recognizable range on the drawings, it is also possible to provide a larger number of mirrors than the number of mirrors shown in the drawings.

Projection-Type Display Device as Electronic Apparatus

FIG. 1 is an explanatory diagram schematically showing an example of an optical system provided to a projection-type display device to which the invention is applied. The projection-type display device 1000 (the electronic apparatus) shown in FIG. 1 includes a light source section 1002, an electro-optic device 100 for modulating the source light emitted from the light source section 1002 in accordance with image information, and a projection optical system 1004 for projecting the light modulated by the electro-optic device 100 on a projection target 1100 such as a screen to form a projected image. The light source section 1002 is provided with a light source 1020 and a color filter 1030. The light source 1020 emits white light as the source light, the color filter 1030 emits the light of the respective colors due to the rotation, and the electro-optic device 100 modulates the incident light at a timing synchronized with the rotation of the color filter 1030. It should be noted that it is possible to use a phosphor substrate, which converts the light emitted from the light source 1020 into the light with the respective colors, instead of the color filter 1030. Further, it is also possible to provide the light source section 1002 and the electro-optic device 100 for the light with each of the colors.

Basic Configuration of Electro-Optic Device 100

Figure 2:
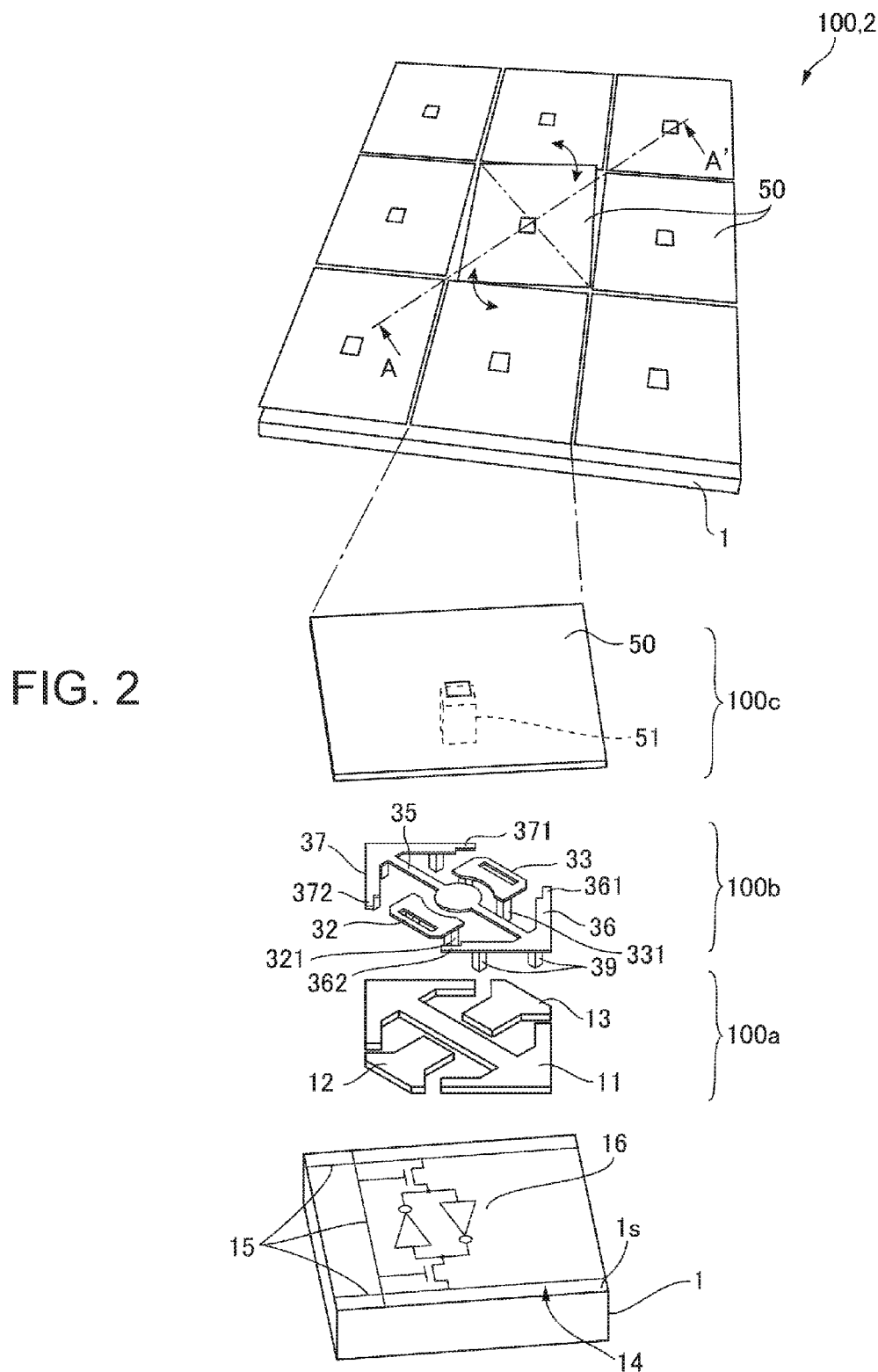
FIG. 2 is an explanatory diagram schematically showing an example of a basic configuration of an electro-optic device to which the invention is applied.
Figure 3:
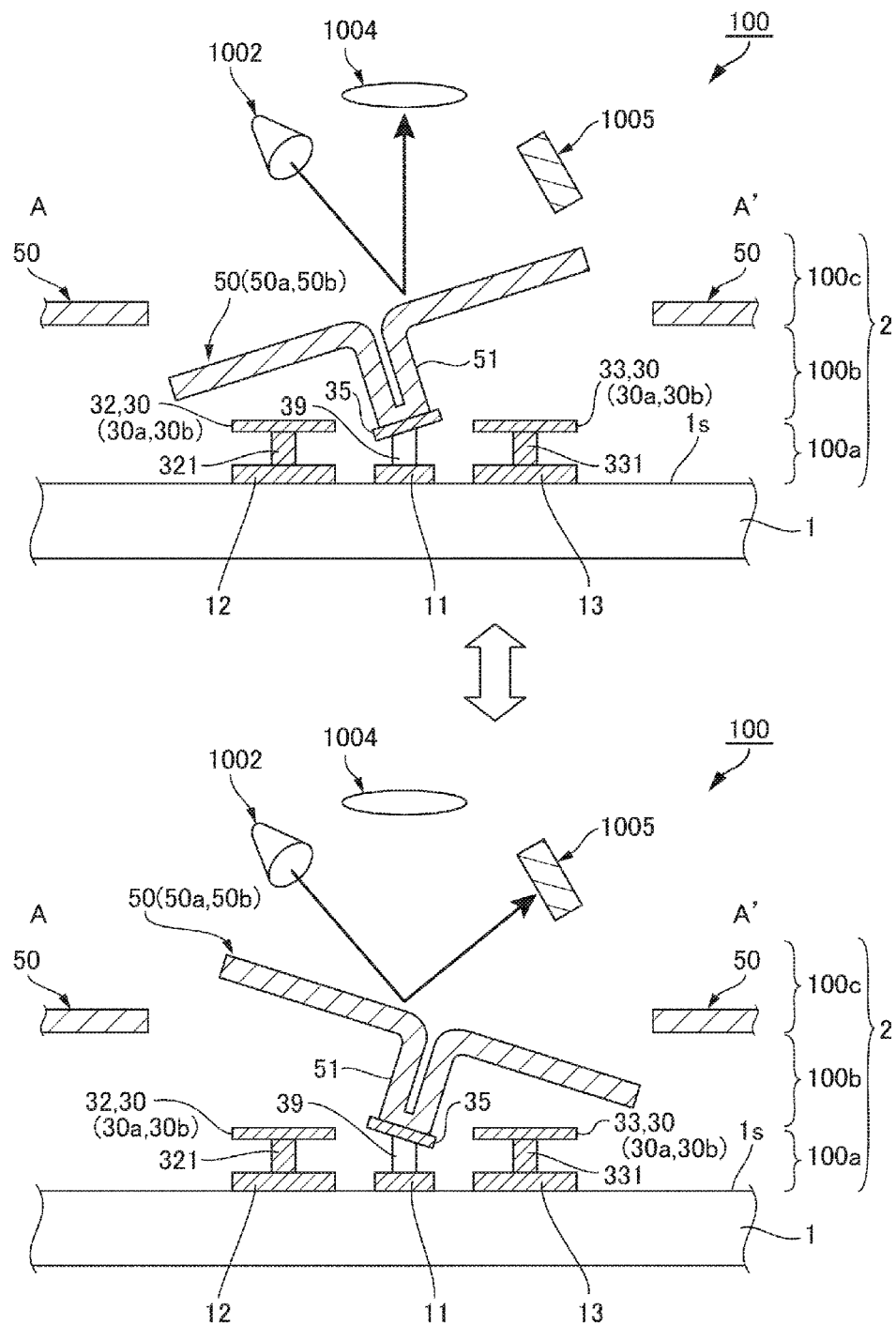
FIG. 3 is an explanatory diagram schematically showing a cross-sectional surface in the periphery of a mirror of the electro-optic device to which the invention is applied.

FIG. 2 is an explanatory diagram schematically showing an example of the basic configuration of the electro-optic device 100 to which the invention is applied, and FIG. 2 also shows a partially exploded condition. FIG. 3 is an explanatory diagram schematically showing a cross-sectional surface in the periphery of a mirror 50 of the electro-optic device 100 to which the invention is applied, and FIG. 3 shows the state in which the mirror 50 is tilted toward one side, and the state in which the mirror 50 is tilted toward the other side.

As shown in FIG. 2 and FIG. 3, the electro-optic device 100 is provided with a chip 2 having a plurality of mirrors 50 arranged in a matrix on one surface 1s of an element substrate 1, and in the chip 2, the mirrors 50 are separated from the element substrate 1. The element substrate 1 is, for example, a silicon substrate. The mirrors 50 are each, for example, a micromirror having a planar size of 10 through 30 μm in each side. The mirrors 50 are arranged in, for example, a matrix of 800×600 through 1028×1024, and each of the mirrors 50 corresponds to one pixel of an image.

The surface of each of the mirrors 50 is a reflecting surface formed of a reflecting metal film made of aluminum or the like. The chip 2 is provided with a first layer part 100a including substrate-side bias electrodes 11, substrate-side address electrodes 12, 13, and so on formed on the one surface 1s of the element substrate 1, a second layer part 100b including elevated address electrodes 32, 33 and hinges 35, and a third layer part 100c including the mirrors 50. In the first layer part 100a, the element substrate 1 is provided with an address designation circuit 14. The address designation circuit 14 is provided with memory cells for selectively controlling the operations of the respective mirrors 50, and interconnections 15 of word lines and bit lines, and has a circuit configuration similar to a RAM (random access memory) provided with a CMOS circuit 16.

The second layer part 100b includes the elevated address electrodes 32, 33, the hinges 35, and mirror posts 51. The elevated address electrodes 32, 33 are electrically connected to the substrate-side address electrodes 12, 13 via the electrode posts 321, 331, and at the same time supported by the substrate-side address electrodes 12, 13, respectively. Hinge arms 36, 37 extend respectively from both ends of the hinge 35. The hinge arms 36, 37 are electrically connected to the substrate-side bias electrode 11 via an arm post 39, and at the same time supported by the substrate-side bias electrode 11. The mirror 50 is electrically connected to the hinge 35 via the mirror post 51, and at the same time supported by the hinge 35. Therefore, the mirror 50 is electrically connected to the substrate-side bias electrode 11 via the mirror post 51, the hinge 35, the hinge arms 36, 37, and the arm post 39, and thus, the substrate-side bias electrode 11 applies a bias voltage to the mirror 50. It should be noted that the tips of the hinge arms 36, 37 are respectively provided with stoppers 361, 362 and stoppers 371, 372 for having contact with the mirror 50 to prevent the mirror 50 and the elevated address electrodes 32, 33 from having contact with each other when the mirror 50 is tilted.

The elevated address electrodes 32, 33 constitute a drive element 30 for generating an electrostatic force with the mirror 50 to drive the mirror 50 to tilt. Further, the substrate-side address electrodes 12, 13 are also configured to generate an electrostatic force with the mirror 50 to drive the mirror 50 to tilt in some cases, and in such cases, it results that the drive element 30 is constituted by the elevated address electrodes 32, 33 and the substrate-side address electrodes 12, 13. The hinge 35 is twisted when the drive voltage is applied to the elevated address electrodes 32, 33, and thus the mirror 50 is tilted so as to be drawn by the elevated address electrode 32 or the elevated address electrode 33, and exerts a force to restore the mirror 50 to the posture parallel to the element substrate 1 when the drive voltage applied to the elevated address electrodes 32, 33 stops to lose the attractive force to the mirror 50.

As shown in FIG. 3, in the electro-optic device 100, for example, when the mirror 50 tilts toward the elevated address electrode 32 on one side, there occurs an ON state in which the light emitted from the light source section 1002 is reflected by the mirror 50 toward the projection optical system 1004. In contrast, when the mirror 50 tilts toward the elevated address electrode 33 on the other side, there occurs an OFF state in which the light emitted from the light source section 1002 is reflected by the mirror 50 toward a light absorption device 1005, and in such an OFF state, no light is reflected toward the projection optical system 1004. Such drive is performed in each of the mirrors 50, and as a result, the light emitted from the light source section 1002 is modulated by the plurality of mirrors 50 into image light, and is then projected from the projection optical system 1004 to display an image.

It should be noted that in some cases, a plate-like yoke opposed to the substrate-side address electrodes 12, 13 is disposed integrally with the hinge 35, the mirror 50 is driven using an electrostatic force acting between the substrate-side address electrodes 12, 13 and the yoke in addition to the electrostatic force generated between the elevated address electrodes 32, 33 and the mirror 50.

Sealing Structure of Electro-Optic Device 100

Figure 4:
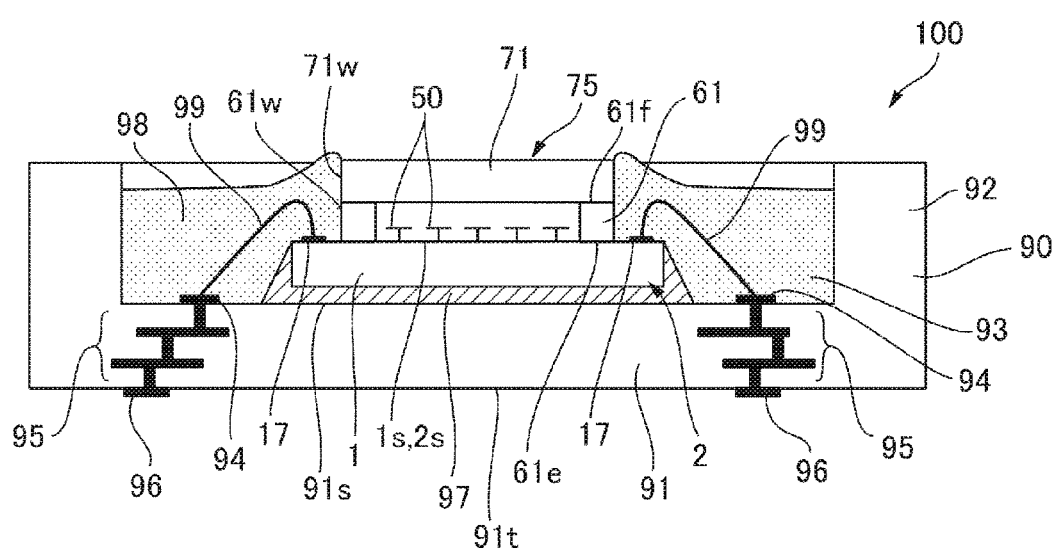
FIG. 4 is an explanatory diagram schematically showing a cross-sectional surface of the whole of the electro-optic device to which the invention is applied.

FIG. 4 is an explanatory diagram schematically showing a cross-sectional surface of the whole of the electro-optic device 100 to which the invention is applied. As shown in FIG. 4, in the electro-optic device 100 according to the present embodiment, the one surface 1s of the element substrate 1 (the chip 2) provided with the plurality of mirrors 50 describe with reference to FIG. 2 and FIG. 3 is sealed with a sealing member 75 formed of a spacer 61 shaped like a frame and a cover 71 shaped like a plate and having a light-transmitting property, then the element substrate 1 (the chip 2) is fixed to a substrate mounting part 93 of a board 90, and is then sealed with a sealing material 98. In the board 90, the substrate mounting part 93 is formed as a bottomed recessed part surrounded by a side plate part 92, and the element substrate 1 is fixed to a bottom plate part 91 of the board 90 with an adhesive 97. In such a manner as described above, the mirrors 50 and the chip 2 are protected from moisture and so on.

In the present embodiment, the cover 71 covers the mirrors 50 in a planar view, and the spacer 61 has contact with one surface 2s of the chip 2 between the cover 71 and the chip 2. More specifically, an end part 61e of the spacer 61 located on the element substrate 1 side is bonded to the one surface 2s of the chip 2, and has contact with the one surface 2s of the chip 2. In the present embodiment, the one surface 2s of the chip 2 is formed of the one surface 1s of the element substrate 1. The cover 71 is bonded to an end part 61f, which is an end part of the spacer 61 located on the opposite side to the end part opposed to the element substrate 1, and is supported by the end part 61f. In this state, the cover 71 is opposed to the surface of each of the mirrors 50 at a position at a predetermined distance from the mirrors 50. Therefore, the light enters the mirror 50 through the cover 71, and then, the light reflected by the mirror 50 is emitted through the cover 71.

On the one surface 1s of the element substrate 1, a plurality of terminals 17 is formed in an end part (outer side of the spacer 61) not overlapping the mirrors 50. In the present embodiment, the terminals 17 are arranged in two lines so as to sandwich the mirrors 50. Some of the terminals 17 are electrically connected to the elevated address electrodes 32, 33 (the drive element 30) via the address designation circuit 14 and the substrate-side address electrodes 12, 13 described with reference to FIG. 2 and FIG. 3. Some of the rest of the terminals 17 are electrically connected to the mirrors 50 via the address designation circuit 14, the substrate-side bias electrodes 11, and the hinges 35 described with reference to FIG. 2 and FIG. 3. Some of the rest of the terminals 17 are electrically connected to the drive circuit and so on disposed in an anterior stage of the address designation circuit 14 described with reference to FIG. 2 and FIG. 3.

Here, the terminals 17 are in an open state on the opposite side to the element substrate 1, and are therefore electrically connected to the internal terminals 94 formed on a surface 91s of the bottom plate part 91 of the board 90 located on the element substrate 1 side with wires 99 for wire bonding. The bottom plate part 91 of the board 90 forms a multilayer interconnection board, and the internal terminals 94 are electrically connected to external terminals 96 formed on an outer surface 91t of the bottom plate part 91 located on the opposite side to the element substrate 1 via the multilayer interconnection parts 95 each formed of through holes and interconnections provided to the bottom plate part 91.

In the inside of the side plate part 92 (the recessed part) of the board 90, there is disposed a sealing material 98 made of resin such as epoxy resin. The sealing material 98 covers the wires 99, bond parts between the wires 99 and the terminals 17, bond parts between the wires 99 and the internal terminals 94, the periphery of the element substrate 1, and the periphery of a bonded part between the spacer 61 and the element substrate 1, and at the same time covers the entire side surface 61w (e.g., a surface for connecting the end part of the spacer 61 opposed to the element substrate 1 and the end part 61f as an end part located on the opposite side to each other) of the spacer 61, and the entire side surface 71w (e.g., a surface for connecting the surface of the cover 71 opposed to the element substrate 1 and the surface on the opposite side to each other) of the cover 71.

First Configuration Example of Countermeasure Against Heat Generation

In the electro-optic device 100 configured as described above, the cover 71 rises in temperature due to the irradiation of light, and if such heat is transferred to the chip 2, the temperature of the chip 2 rises, and the reliability deteriorates. Therefore, in the present embodiment, the magnitude relation in thermal conductively between the chip 2, the spacer 61, and the cover 71 is set in advance as described hereinafter.

Firstly, in the one surface 2s of the chip 2, the entire part having contact with the spacer 61 is made of a first material having first thermal conductivity. In the present embodiment, the one surface 2s of the chip 2 is formed of the one surface 1s of the element substrate 1, and the entire part having contact with the spacer 61 in the one surface 1s formed of a silicon oxide film (the first material) deposited when forming the address designation circuit 14 (see FIG. 2) and so on using a semiconductor process. The thermal conductivity (the first thermal conductivity) of the silicon oxide film (the first material) is equal to or lower than 3.0 W/(m·K).

The spacer 61 is made of a second material having second thermal conductivity higher than the thermal conductivity (the first thermal conductivity) of the silicon oxide film (the first material). In the present embodiment, the spacer 61 is made of a quartz crystal (the second material), and the thermal conductivity (the second thermal conductivity) of the quartz crystal (the second material) is about 8.0 W/(m·K).

In the present embodiment, the cover 71 is made of a third material having third thermal conductivity higher than the thermal conductivity (second thermal conductivity) of the quartz crystal (the second material). In the present embodiment, the cover 71 is made of sapphire (the third material), and the thermal conductivity (the third thermal conductivity) of sapphire (the third material) is about 42 W/(m·K).

Therefore, in the present embodiment, the thermal conductivities have the following relation.

(one surface 2s of chip 2)<(spacer 61)<(cover 71)

Therefore, the heat of the cover 71 is hard to be transferred to the chip 2 via the spacer 61. Further, while operating, although the chip 2 itself generates heat, the heat generated in the chip 2 is easily released to the cover 71 side via the spacer 61. Therefore, since the rise in temperature of the chip 2 can be suppressed, reliability of the chip 2 and the electro-optic device 100 can be improved.

Further, in the present embodiment, the sealing material 98 covers the one surface 2s of the chip 2 on the outer side of the spacer 61. Therefore, it is possible to release the heat of the chip 2 to the sealing material 98. Further, the sealing material 98 covers the entire side surface 61w of the spacer 61 and the entire side surface 71w of the cover 71. Therefore, it is possible to release the heat of the cover 71 and the heat of the spacer 61 to the sealing material 98.

Second Configuration Example of Countermeasure Against Heat Generation

In order to reduce the rise in temperature of the chip 2, the following configuration can also be adopted. Firstly, the whole of the part having contact with the spacer 61 in the one surface 2s (the one surface 1s of the element substrate 1) of the chip 2 is formed of a silicon oxide film (a first material), and the thermal conductivity (first thermal conductivity) of the silicon oxide film (the first material) is equal to or lower than 3.0 W/(m·K).

The spacer 61 is made of a second material having second thermal conductivity higher than the thermal conductivity (the first thermal conductivity) of the silicon oxide film (the first material). In the present embodiment, the spacer 61 is made of sapphire (a second material), and the thermal conductivity (second thermal conductivity) of sapphire (the second material) is about 42 W/(m·K).

The cover 71 is made of a third material having third thermal conductivity lower than the thermal conductivity (the second thermal conductivity) of sapphire (the second material). In the present embodiment, the cover 71 is made of a quartz crystal (a third material), and the thermal conductivity (third thermal conductivity) of the quartz crystal (the third material) is about 8.0 W/(m·K). Therefore, the thermal conductivity (the third thermal conductivity) of the cover 71 is higher than the thermal conductivity (the first thermal conductivity) of the one surface 2s of the chip 2.

Therefore, in the present embodiment, the thermal conductivities have the following relation.

(one surface 2s of chip 2)<(cover 71)<(spacer 61)

Therefore, similarly to the first configuration example, the heat of the cover 71 is hard to be transferred to the chip 2 via the spacer 61. Further, while operating, although the chip 2 itself generates heat, the heat generated in the chip 2 is easily released to the spacer 61. Therefore, since the rise in temperature of the chip 2 can be suppressed, reliability of the chip 2 and the electro-optic device 100 can be improved.

Further, in the present embodiment, the sealing material 98 covers the one surface 2s of the chip 2 on the outer side of the spacer 61. Therefore, it is possible to release the heat of the chip 2 to the sealing material 98. Further, the sealing material 98 covers the entire side surface 61w of the spacer 61 and the entire side surface 71w of the cover 71. Therefore, it is possible to release the heat of the cover 71 and the heat of the spacer 61 to the sealing material 98.

Third Configuration Example of Countermeasure Against Heat Generation

In order to reduce the rise in temperature of the chip 2, the following configuration can also be adopted. Firstly, the whole of the part having contact with the spacer 61 in the one surface 2s (the one surface 1s of the element substrate 1) of the chip 2 is formed of the silicon oxide film (a first material), and the thermal conductivity (first thermal conductivity) of the silicon oxide film (the first material) is equal to or lower than 3.0 W/(m·K).

The spacer 61 is made of a second material having second thermal conductivity higher than the thermal conductivity (the first thermal conductivity) of the silicon oxide film (the first material). In the present embodiment, the spacer 61 is made of sapphire (a second material), and the thermal conductivity (second thermal conductivity) of sapphire (the second material) is about 42 W/(m·K). The cover 71 is made of the same material (sapphire) as that of the spacer 61. Further, it is also possible to form both of the spacer 61 and the cover 71 using sapphire.

Therefore, in the present embodiment, the thermal conductivities have the following relation.

(one surface 2s of chip 2)<(spacer 61)=(cover 71)

Therefore, similarly to the first configuration example, the heat of the cover 71 is hard to be transferred to the chip 2 via the spacer 61. Further, while operating, although the chip 2 itself generates heat, the heat generated in the chip 2 is easily released to the spacer 61 and the cover 71. Therefore, since the rise in temperature of the chip 2 can be suppressed, reliability of the chip 2 and the electro-optic device 100 can be improved.

Further, in the present embodiment, the sealing material 98 covers the one surface 2s of the chip 2 on the outer side of the spacer 61. Therefore, it is possible to release the heat of the chip 2 to the sealing material 98. Further, the sealing material 98 covers the entire side surface 61w of the spacer 61 and the entire side surface 71w of the cover 71. Therefore, it is possible to release the heat of the cover 71 and the heat of the spacer 61 to the sealing material 98.

It should be noted that since in the present example, the spacer 61 and the cover 71 are made of the same material, it is also possible to use the sealing member 75 having the spacer 61 and the cover 71 integrated with each other.

Method of Manufacturing Electro-Optic Device 100

Figure 5:
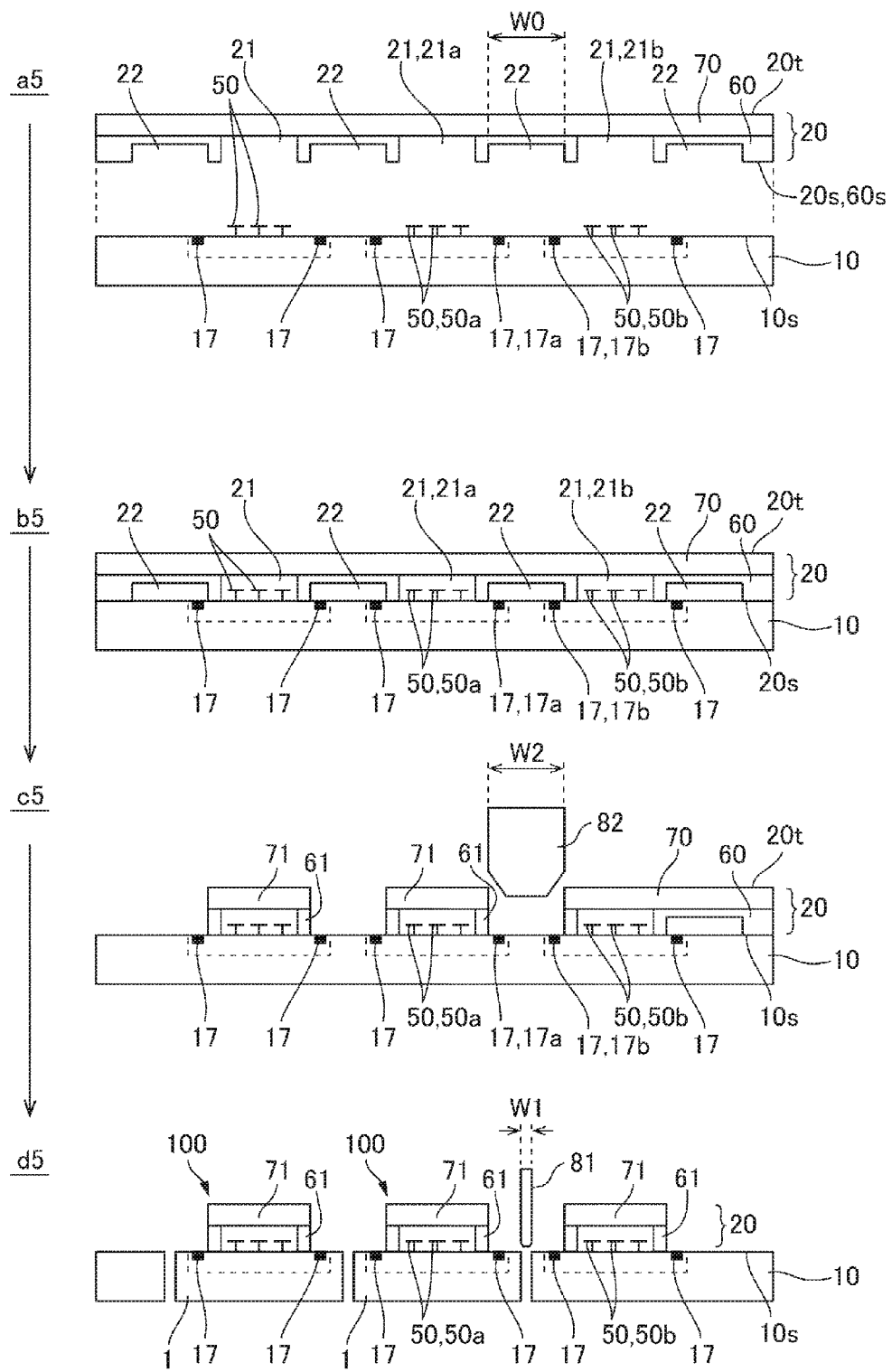
FIG. 5 is a process cross-sectional view showing a method of manufacturing the electro-optic device to which the invention is applied.
Figure 6:
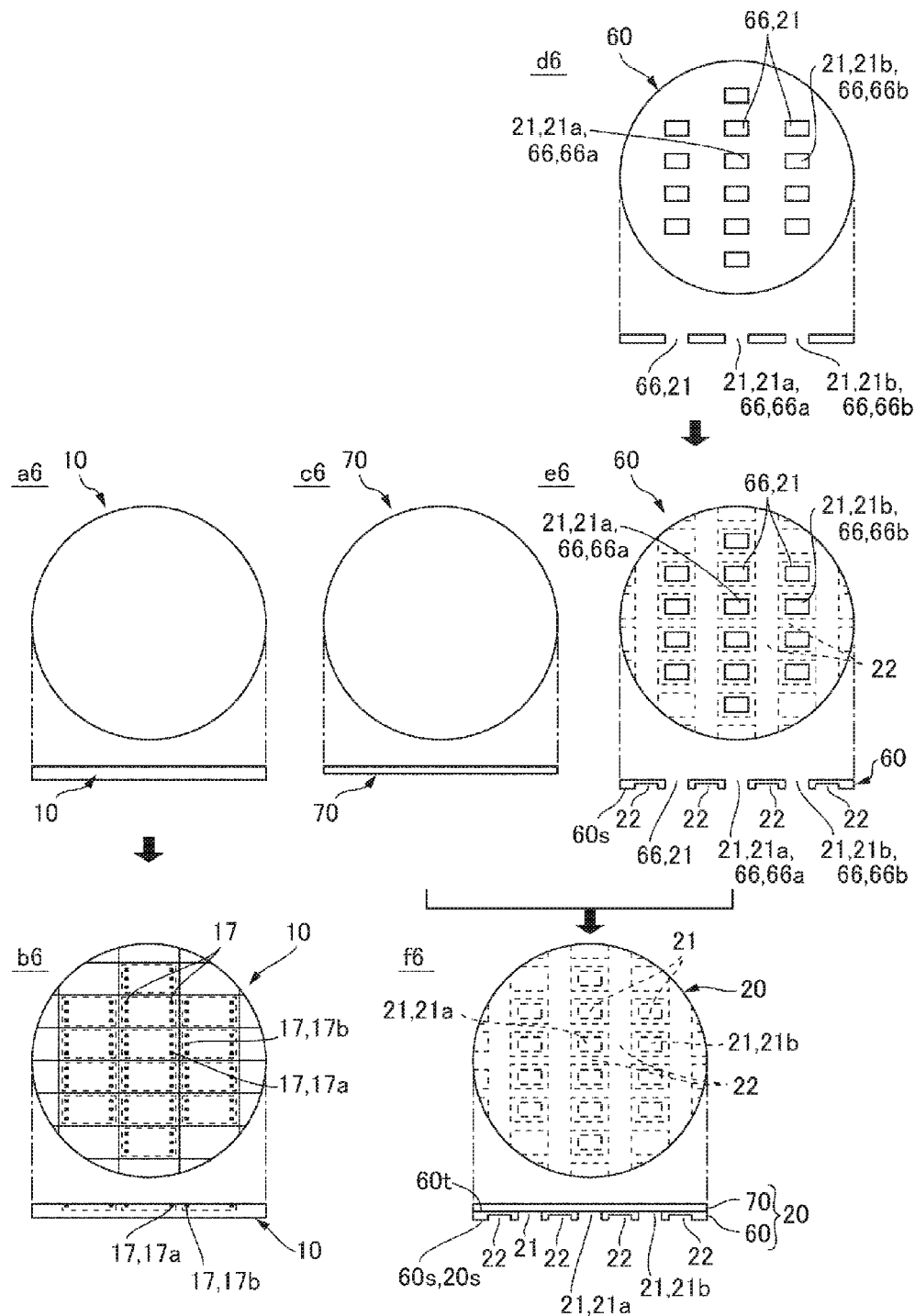
FIG. 6 is a process chart showing a method of manufacturing a second wafer and so on used for the manufacture of the electro-optic device to which the invention is applied.
Figure 7:
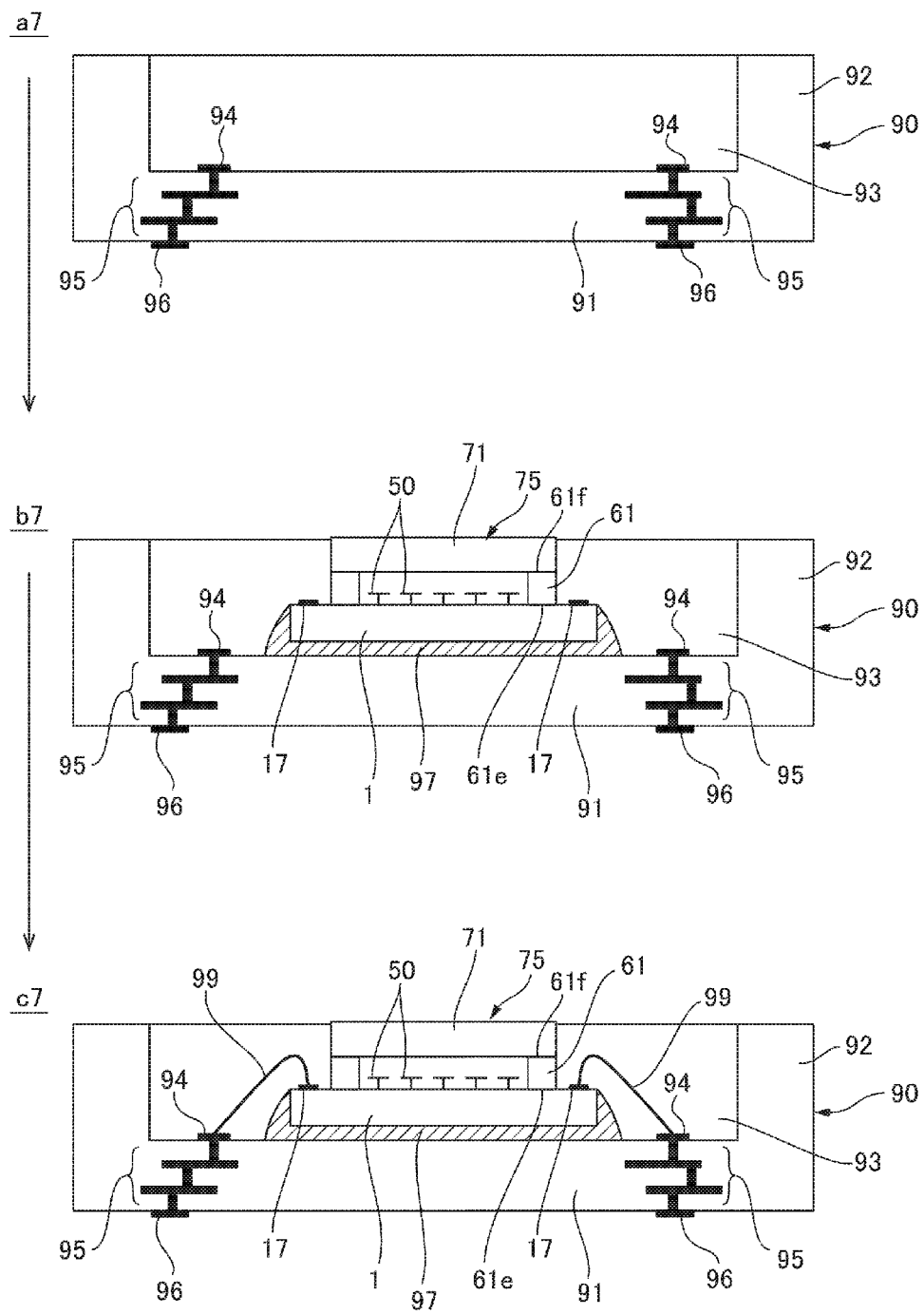
FIG. 7 is a process cross-sectional view showing a process of sealing a substrate with a board and sealing resin in a manufacturing process of the electro-optic device to which the invention is applied.

A method of manufacturing the electro-optic device 100 to which the invention is applied will be described with reference to FIG. 5, FIG. 6, and FIG. 7. FIG. 5 is a process cross-sectional view showing the method of manufacturing the electro-optic device 100 to which the invention is applied. FIG. 6 is a process chart showing a manufacturing method of a second wafer 20 and so on used in the manufacture of the electro-optic device 100 to which the invention is applied, and FIG. 6 shows a plan view of the wafer in each process, and at the same time shows a cross-sectional view below the plan view. FIG. 7 is a process cross-sectional view showing a process of sealing the element substrate 1 with the board 90 and the sealing material 98 in the manufacturing process of the electro-optic device 100 to which the invention is applied. In FIG. 6, illustration of the mirrors 50 and so on is omitted, and in FIG. 5, it is assumed that the number of mirrors 50 is decreased compared to FIG. 4, and three mirrors 50 are provided to one element substrate 1.

In the present embodiment, a plurality of element substrates 1 and so on are obtained from a wafer with multi-piece processing. Therefore, in the following description, among the plurality of element substrates 1 obtained with the multi-piece processing, the mirrors 50 and the terminals 17, which are formed in an area where one substrate is obtained, are described attaching "a" to the back of each of the reference symbols like "first mirrors 50a" and "first terminals 17a." Further, among the plurality of element substrates 1, the mirrors 50 and the terminals 17, which are formed in an area adjacent to the area where the first mirrors 50a and the first terminals 17a are formed, are described attaching "b" to the back of each of the reference symbols like "second mirrors 50b" and "second terminals 17b." It should be noted that in the case in which there is no need to specify which element substrate 1 is mentioned, the description will be presented without attaching "a" or "b" described above.

In order to manufacture the electro-optic device 100 according to the present embodiment, in the process a5 shown in FIG. 5 and the processes a6, b6 (a first wafer preparatory process) shown in FIG. 6, there is prepared a first wafer 10, which is large in size, and with which the multi-piece processing of the element substrates 1 can be realized, wherein the mirrors 50 and the terminals 17 are formed in each of the areas which are divided to obtain the element substrates 1, of one surface 10s (a first surface) of the first wafer 10.

Therefore, on the one surface 10s of the first wafer 10, the first mirrors 50a are formed, and at the same time, the first terminals 17a electrically connected to the first drive element 30a (see FIG. 2 and FIG. 3) for driving the first mirrors 50a are formed at positions adjacent to the first mirrors 50a in a planar view. Further, on the one surface 10s of the first wafer 10, there are formed the second mirrors 50b on the opposite side to the first mirrors 50a with respect to the first terminals 17a, and at the same time, there are formed the second terminals 17b electrically connected to the second drive element 30b (see FIG. 2 and FIG. 3) for driving the second mirrors 50b between the first terminals 17a and the second mirrors 50b.

Further, in the process a5 (a second wafer forming process) shown in FIG. 5, there is prepared a second wafer 20, which is large in size, and with which the multi-piece processing of the spacers 61 and the covers 71 can be realized. On a second surface 20s formed of one surface of the second wafer 20, a recessed part 21, the bottom part of which has a light-transmitting property, is formed in each of the areas which are divided to obtain the spacers 61 and the covers 71, and at the same time, there are formed grooves 22 each having a bottom and extending in two directions perpendicular to each other to surround each of the recessed parts 21. One of the recessed parts 21 corresponds to a first recessed part 21a, and the recessed part 21 adjacent to the first recessed part 21a corresponds to a second recessed part 21b. Therefore, on the second surface 20s of the second wafer 20, there are formed the first recessed part 21a, the bottom part of which has a light-transmitting property, the second recessed part 21b, the bottom part of which has a light-transmitting property, and the grooves 22 each having a bottom and extending along the space between the first recessed part 21a and the second recessed part 21b.

When forming such a second wafer 20, in the second wafer forming process, for example, the processes c6 through f6 shown in FIG. 6 are performed. Firstly, in the process c6, there is prepared a light-transmitting wafer 70 (a fourth wafer), with which the multi-piece processing of the covers 71 can be realized. Further, in the process d6, a wafer-for-spacers 60 (a third wafer) with which the multi-piece processing of the spacers 61 can be realized is prepared, and then, in the first process, through holes 66 for forming the recessed parts 21 are formed in the wafer-for-spacers 60 using a process such as etching. One of the through holes 66 corresponds to a first through hole 66a for forming the first recessed part 21a, and the through hole 66 adjacent to the first through hole 66a corresponds to a second through hole 66b for forming the second recessed part 21b. Then, in the process e6, the grooves 22 each having a bottom and extending in the two directions perpendicular to each other to surround each of the recessed parts 21 are formed using a process such as half etching. It should be noted that although in the first process, the through holes 66 are formed and then the grooves 22 are formed, it is also possible to form the grooves 22 and then form the through holes 66.

Then, in the second process, as shown in the process f6, the light-transmitting wafer 70 is stacked on and bonded to a surface 60t of the wafer-for-spacers 60 located on the opposite side to a surface 60s on which the grooves 22 open. As a result, the second wafer 20 having the wafer-for-spacers 60 and the light-transmitting wafer 70 stacked on one another is formed, and in such a second wafer 20, the surface 60s of the wafer-for-spacers 60 forms the second surface 20s of the second wafer 20, and the surface of the light-transmitting wafer 70 located on the opposite side to the wafer-for-spacers 60 forms a third surface 20t of the second wafer 20. Further, one opening ends of the through holes 66 (the first through hole 66a and the second through hole 66b) are blocked by the light-transmitting wafer 70 to form the recessed parts 21 (the first recessed part 21a and the second recessed part 21b), the bottom parts of which have a light-transmitting property.

Then, in the bonding process, in the process b5 shown in FIG. 5, the one surface 10s of the first wafer 10 and the second surface 20s of the second wafer 20 are bonded to each other so that the recessed parts 21 overlap the mirrors 50 in a planar view (e.g., the planar view when viewing the first wafer 10 from the one surface 10s side), and the grooves 22 overlap the terminals 17. As a result, the first recessed part 21a overlaps the first mirrors 50a in the planar view, the second recessed part 21b overlaps the second mirrors 50b in the planar view, the common groove 22 overlaps the first terminals 17a, the second terminals 17b, and an area sandwiched by the first terminals 17a and the second terminals 17b in the planar view. In this state, the part sandwiched by the first recessed part 21a and the groove 22 in the second wafer 20 is bonded to the area between the first mirrors 50a and the first terminals 17a, and the part sandwiched by the second recessed part 21b and the groove 22 in the second wafer 20 is bonded to the area between the second mirrors 50b and the second terminals 17b. Therefore, the first terminals 17a and the second terminals 17b are not bonded to the second wafer 20.

Then, in the process c5 (a second wafer dicing process) shown in FIG. 5, a dicing blade-for-second wafer 82 (a first dicing blade) is made to approach from the third surface 20t, which is formed of a surface of the second wafer 20 located on the opposite side to the second surface 20s, to dice the second wafer 20 along the grooves 22. As a result, the second wafer 20 is divided, the cover 71 is constituted by a plate part obtained by dividing the light-transmitting wafer 70 out of the second wafer 20, and the spacer 61 is constituted by a frame part obtained by dividing the wafer-for-spacers 60. In the present embodiment, the thickness W2 of the dicing blade-for-second wafer 82 is equivalent to the width W0 of the groove 22.

Then, in the process d5 (a first wafer dicing process) shown in FIG. 5, the first wafer 10 is diced along the area (the area sandwiched by the first terminals 17a and the second terminals 17b) which are divided to obtain the element substrates 1 using a dicing blade-for-first wafer 81 (a second dicing blade). As a result, the first wafer 10 is diced in the area between the first terminals 17a and the second terminals 17b. In the present embodiment, the thickness W1 of the dicing blade-for-first wafer 81 is thinner than the thickness W2 of the dicing blade-for-second wafer 82. Therefore, in the first wafer dicing process, the dicing blade-for-first wafer 81 is made to approach the cut place (an area between the covers 71 adjacent to each other, and an area between the spacers 61 adjacent to each other) of the second wafer 20 from the side of the second wafer 20 with respect to the first wafer 10 to dice the first wafer 10.

As a result, there is manufactured a plurality of electro-optic devices 100 each having the element substrate 1, which is provided with the mirrors 50 formed on the one surface 1s, and the one surface 1s of which is sealed with the spacer 61 and the cover 71. In the case of further sealing such an electro-optic device 100 with the board 90 and the sealing material 98 as shown in FIG. 4, the process shown in FIG. 7 is performed.

Firstly, in the process a7 shown in FIG. 7, the board 90 having the substrate mounting part 93 formed as the recessed part surrounded by the side plate part 92 is prepared, and then in the process b7 shown in FIG. 7, the element substrate 1 is fixed to the bottom part of the substrate mounting part 93 with the adhesive 97. Then, in the process c7 shown in FIG. 7, the terminals 17 on the element substrate 1 and the internal terminals 94 on the board 90 are electrically connected to each other with the wires 99 for wire bonding. Then, as shown in FIG. 4, the sealing material 98 is poured inside the side plate part 92 of the board 90, and then the sealing material 98 is made to cure to seal the element substrate 1 with the sealing material 98. As a result, it is possible to obtain the electro-optic device 100 having the element substrate 1 sealed with the spacer 61, the cover 71, the board 90, and the sealing material 98.

Configuration of Electro-Optic Unit 180

Figure 8:
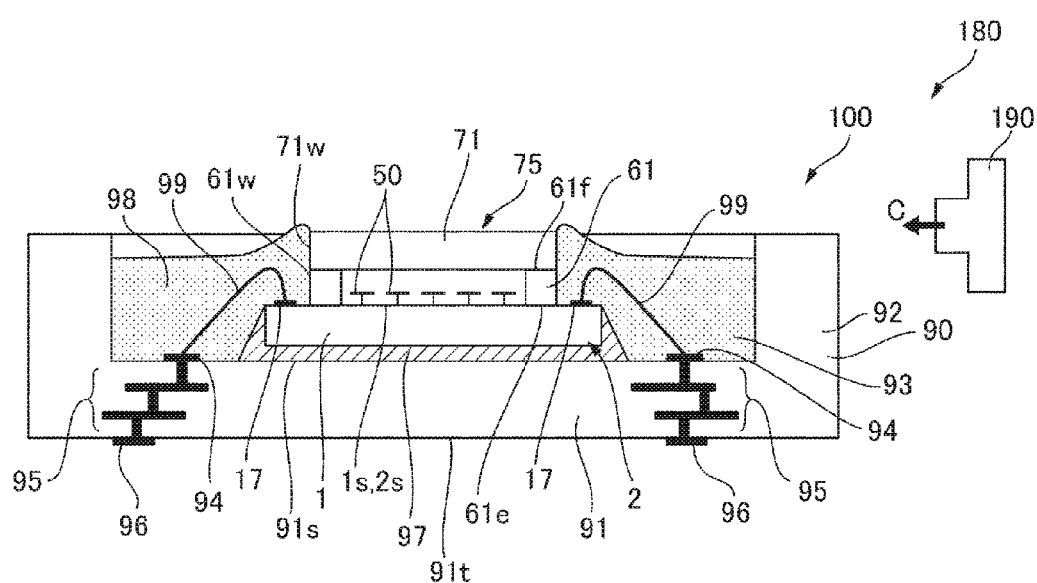
FIG. 8 is an explanatory diagram of an electro-optic unit to which the invention is applied.
Figure 9:
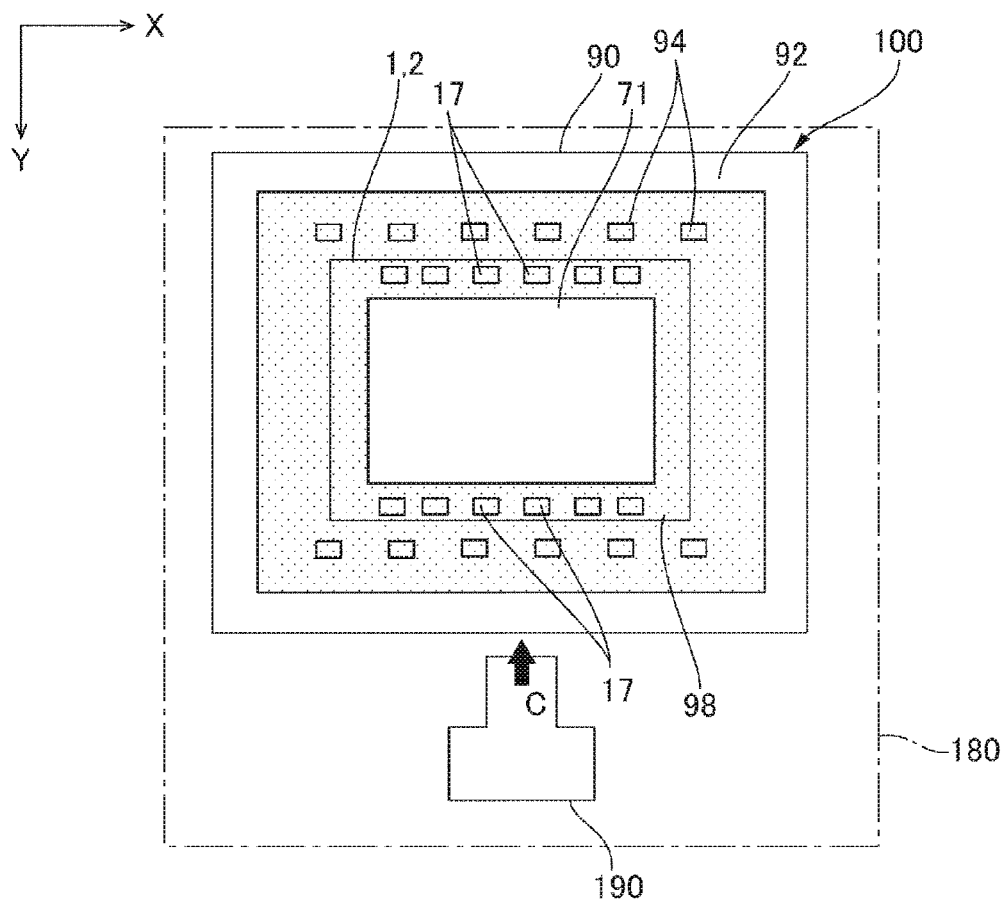
FIG. 9 is an explanatory diagram showing a blowing direction in the electro-optic unit to which the invention is applied.
Figure 10:
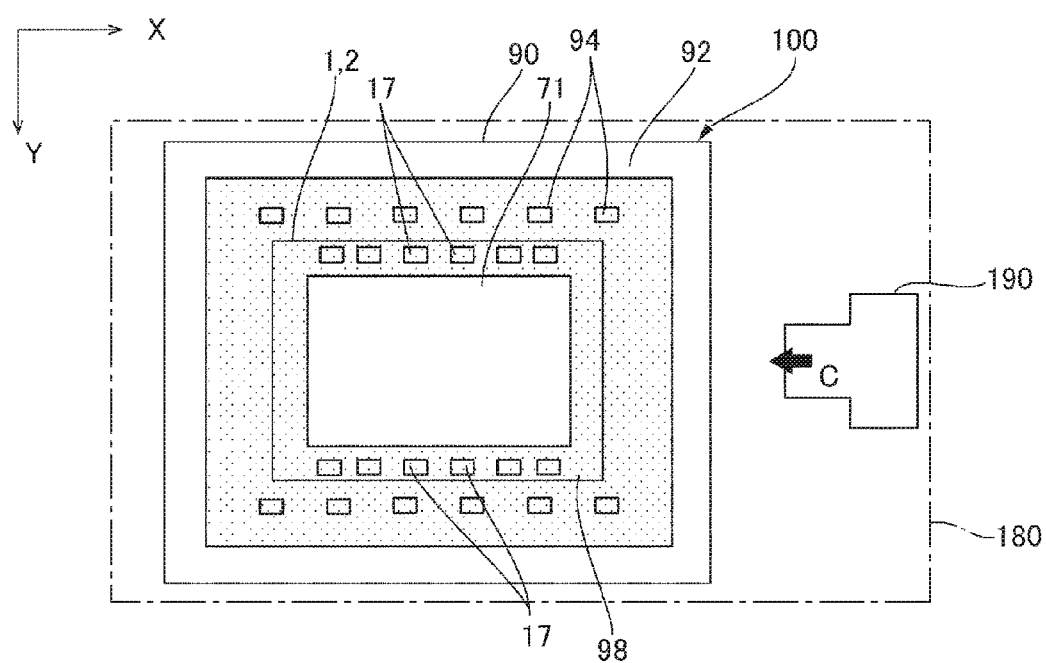
FIG. 10 is an explanatory diagram showing a blowing direction in another embodiment of the electro-optic unit to which the invention is applied.

FIG. 8 is an explanatory diagram of an electro-optic unit 180 to which the invention is applied. FIG. 9 is an explanatory diagram showing a blowing direction in the electro-optic unit 180 to which the invention is applied. FIG. 10 is an explanatory diagram showing a blowing direction in another embodiment of the electro-optic unit 180 to which the invention is applied.

When using the electro-optic device 100 described with reference to FIG. 2 through FIG. 7 for the projection-type display device 1000 shown in FIG. 1 or the like, in the present embodiment, the electro-optic unit 180 is constituted by the electro-optic device 100, and a blower 190 for supplying air to the electro-optic device 100 as shown in FIG. 8 and FIG. 9. The size of the electro-optic device 100 according to the present embodiment in the Y direction, in which the terminals 17 are opposed to each other across the cover 71, is smaller than the size of the electro-optic device 100 in the X direction, in which the terminals 17 are arranged, and in the present embodiment, the blower 190 feeds the air from the Y direction in which the size of the electro-optic device 100 is smaller.

It should be noted that as shown in FIG. 10, it is also possible to adopt a configuration in which the blower 190 feeds the air from the X direction in which the size of the electro-optic device 100 is larger.

What is claimed is:

1. An electro-optic device comprising:
a chip provided with a mirror and a drive element adapted to drive the mirror;
a light-transmitting cover adapted to cover the mirror in a planar view; and
a spacer located between the cover and the chip, and having contact with one surface of the chip,
wherein an entire part of the one surface having contact with the spacer is made of a first material having first thermal conductivity, and
the spacer is made of a second material having second thermal conductivity higher than the first thermal conductivity.

2. The electro-optic device according to claim 1, further comprising:
a sealing material adapted to cover an entire side surface of the spacer and an entire side surface of the cover.

3. The electro-optic device according to claim 1, wherein the cover is made of a third material having third thermal conductivity higher than the second thermal conductivity.

4. The electro-optic device according to claim 1, wherein the cover is made of a third material having third thermal conductivity lower than the second thermal conductivity.

5. The electro-optic device according to claim 1, wherein the spacer and the cover are made of a same material.

6. An electro-optic unit comprising:
the electro-optic device according to claim 1; and
a blower adapted to supply air to the electro-optic device.

7. An electronic apparatus comprising:
the electro-optic device according to claim 1; and
a light source section adapted to irradiate the mirror with source light.

* * * * *